/ United States Patent (12) United States Patent
Kamimurai et al.

(10) Patent No.: US 10,218,299 B2
(45) Date of Patent: Feb. 26, 2019

(54) PHASE VOLTAGE DETECTION CIRCUIT AND POWER GENERATION CONTROL DEVICE

(71) Applicant: Mitsubishi Electric Corporation, Tokyo (JP)

(72) Inventors: Akio Kamimurai, Tokyo (JP); Keisuke Katsurada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 118 days.

(21) Appl. No.: 15/258,557

(22) Filed: Sep. 7, 2016

(65) Prior Publication Data

US 2017/0279390 A1 Sep. 28, 2017

(30) Foreign Application Priority Data

Mar. 28, 2016 (JP) .................................. 2016-063074

(51) Int. Cl.
*H02P 9/02* (2006.01)
*H02P 9/08* (2006.01)
*G01R 25/00* (2006.01)

(52) U.S. Cl.
CPC ................ *H02P 9/08* (2013.01); *G01R 25/00* (2013.01)

(58) Field of Classification Search
CPC .................................. G01R 25/00; H02P 9/08
See application file for complete search history.

(56) References Cited

U.S. PATENT DOCUMENTS

| 4,028,627 A * | 6/1977 | Cho ....................... G01R 19/04 381/58 |
| 4,853,605 A * | 8/1989 | Matsuo ................. D06F 39/003 318/729 |
| 4,922,188 A * | 5/1990 | Mario ..................... G01R 19/04 324/103 P |

(Continued)

FOREIGN PATENT DOCUMENTS

| JP | H01-094268 | 4/1989 |
| JP | H02-244200 | 9/1990 |

(Continued)

OTHER PUBLICATIONS

Preliminary Notice of Reasons for Rejection, dated Jan. 31, 2017.

*Primary Examiner* — Tulsidas C Patel
*Assistant Examiner* — S. Mikailoff
(74) *Attorney, Agent, or Firm* — Sughrue Mion, PLLC; Richard C. Turner (57) ABSTRACT

An object of this invention is to obtain a phase voltage detection circuit that can detect a phase voltage signal reliably even when a leak current flows therein and a DC bias voltage of the phase voltage signal varies. A phase voltage detection circuit that detects a phase voltage signal generated by an armature coil of an AC power generator includes a peak hold circuit that determines an envelope of the phase voltage signal using an operational amplifier, a voltage offsetting circuit that shifts an output voltage from the peak hold circuit by a preset offset amount, and a comparator that compares the phase voltage signal with an output voltage from the voltage offsetting circuit, and outputs a phase voltage detection signal.

10 Claims, 5 Drawing Sheets

(56) References Cited

U.S. PATENT DOCUMENTS

| | | | |
|---|---|---|---|
| 6,429,696 B1* | 8/2002 | Kao | G01R 15/125 327/58 |
| 2010/0073033 A1* | 3/2010 | Lim | G01R 19/04 327/58 |
| 2013/0169265 A1* | 7/2013 | Tamura | G01R 25/00 324/76.77 |

FOREIGN PATENT DOCUMENTS

| | | |
|---|---|---|
| JP | H07-31078 | 2/1995 |
| JP | 2002-125398 A | 4/2002 |

* cited by examiner

PHASE VOLTAGE DETECTION CIRCUIT AND POWER GENERATION CONTROL DEVICE

BACKGROUND OF THE INVENTION

1. Field of the Invention

This invention relates to a phase voltage detection circuit applied to an AC power generator for a vehicle, for example, and a power generation control device employing the phase voltage detection circuit.

2. Description of the Related Art

An AC power generator for a vehicle typically includes a power generation control device, a field coil, an armature coil, and a rectifier. The power generation control device supplies an excitation current to the field coil, and controls a power generation voltage by adjusting the excitation current.

At this time, a phase voltage signal generated by the armature coil is input into the power generation control device, whereupon the phase voltage signal is detected by a phase voltage detection circuit and waveform-shaped so as to form a digital signal. The power generation control device executes processing to detect an engine rotation speed and so on using a digital circuit on the basis of the waveform-shaped phase voltage signal.

Normally, an AC power generator for a vehicle supplies an excitation current to the field coil in order to start generating power upon reception of an activation signal from a vehicle control unit or an activation signal linked directly to an ignition key, these activation signals being transmitted over a signal line connected to the vehicle side. Here, when an open fault or a ground short fault occurs on the signal line, the activation signals cannot be received from the vehicle during engine startup, and as a result, power generation cannot be started.

However, power generation can be started even in this condition by making the vehicle AC power generator capable of independent power generation. More specifically, when the vehicle AC power generator rotates, a miniscule phase voltage signal is generated in the armature coil of the vehicle AC power generator by residual magnetic flux even in a case where an excitation current has not been supplied to the field coil by the power generation control device. As a result, a rotation condition of the engine can be estimated from the generated phase voltage signal.

In this case, it is necessary to detect the miniscule phase voltage signal generated by the residual magnetic flux as described above. Moreover, a frequency of the phase voltage signal is commensurate with the engine rotation speed, and therefore the phase voltage signal must be detected within a rotation range used by the engine. Accordingly, the phase voltage detection circuit is required to detect a phase voltage signal that is generated by residual magnetic flux and has an amplitude of no less than approximately 0.2 V and a frequency range of several hundred Hz.

Note that when a leak current is generated in a diode constituting the rectifier prior to power generation, the leak current flows into the phase voltage detection circuit, leading to an increase in a DC bias voltage of the phase voltage signal. Here, the leak current varies in accordance with manufacturing irregularities, contact resistance, and deterioration over time in the diode, and therefore the DC bias voltage of the phase voltage signal also varies. As a result, the phase voltage signal cannot be detected using a fixed threshold voltage.

Hence, to solve the problem described above, a technique of determining an envelope of the phase voltage signal using a peak hold circuit and generating a variable threshold voltage using the obtained envelope so that the phase voltage signal can be detected even when the DC bias voltage of the phase voltage signal is indefinite has been disclosed (see Japanese Patent Application Publication No. 2002-125398, for example).

SUMMARY OF THE INVENTION

However, Japanese Patent Application Publication No. 2002-125398 employs a configuration in which a diode is used as the peak hold circuit, and therefore the phase voltage signal cannot be detected when the phase voltage signal is at or below approximately 0.7 V, i.e. a forward voltage of the diode. As described above, the phase voltage detection circuit is required to detect a phase voltage signal having an amplitude of no less than approximately 0.2 V, but with a configuration in which a diode is used, a phase voltage signal having an amplitude of 0.2 V and a DC bias voltage of 0.2 V, for example, cannot be detected.

Further, in Japanese Patent Application Publication No. 2002-125398, an output of the peak hold circuit is not a complete envelope due to a time constant, and therefore the phase voltage signal and an output signal of the peak hold circuit intersect such that the phase voltage signal can be detected by a comparator. With a configuration employing a signal delay generated in accordance with a time constant, however, the amplitude of the phase voltage signal to be detected cannot be set. Therefore, even when it is not necessary to detect phase voltage signals having small amplitudes, phase voltage signals having an amplitude of 0.1 V, for example, are still detected.

To summarize the content described heretofore, the phase voltage detection circuit must detect the phase voltage signal even when a leak current flows therein, leading to an increase in the DC bias voltage. At this time, a current amount of the inflowing leak current is indefinite, and it is therefore necessary to provide a circuit configuration with which a phase voltage signal can be detected reliably anywhere between a battery potential and a reference potential, likewise when no leak current exists.

However, with the configuration disclosed in Japanese Patent Application Publication No. 2002-125398, in which a diode is used as the peak hold circuit, a phase voltage signal at or below the forward voltage of the diode cannot be detected. Moreover, to prevent a malfunction caused by erroneous detection of a phase voltage signal, a circuit configuration with which the amplitude of the phase voltage signal to be detected can be set easily during circuit design is required, but in a case where the phase voltage detection circuit is formed from an integrated circuit, it is difficult to make miniscule adjustments to the time constant of the circuit.

This invention has been designed to solve the problems described above, and an object thereof is to obtain a phase voltage detection circuit that can detect a phase voltage signal reliably even when a leak current flows therein and a DC bias voltage of the phase voltage signal varies.

A phase voltage detection circuit according to this invention detects a phase voltage signal generated by an armature coil of an AC power generator, and includes a peak hold circuit that determines an envelope of the phase voltage signal using an operational amplifier, a voltage offsetting circuit that shifts an output voltage from the peak hold circuit by a preset offset amount, and a comparator that compares the phase voltage signal with an output voltage from the voltage offsetting circuit, and outputs a phase voltage detection signal.

With the phase voltage detection circuit according to this invention, the peak hold circuit determines the envelope of the phase voltage signal using the operational amplifier, the voltage offsetting circuit shifts the output voltage from the peak hold circuit by the preset offset amount, and the comparator compares the phase voltage signal with the output voltage from the voltage offsetting circuit and outputs the phase voltage detection signal.

As a result, a phase voltage signal can be detected reliably even when a leak current flows in and a DC bias voltage of the phase voltage signal varies.

DESCRIPTION OF THE PREFERRED EMBODIMENTS

Preferred embodiments of a phase voltage detection circuit according to this invention will be described below using the drawings. Identical or corresponding parts of the drawings will be described using identical reference numerals.

First Embodiment

Figure 1:
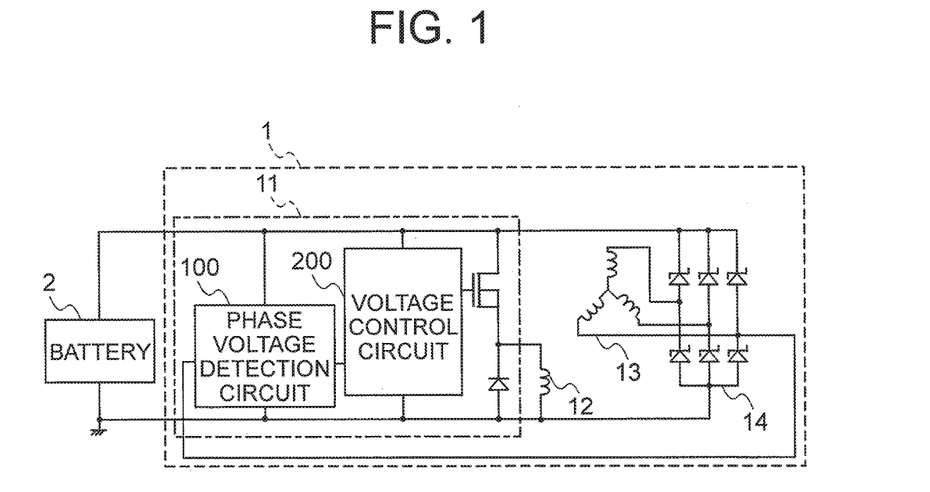
FIG. 1 is a view showing a configuration of an AC power generator for a vehicle, to which a phase voltage detection circuit according to a first embodiment of this invention is applied.

FIG. 1 is a view showing a configuration of an AC power generator for a vehicle, to which a phase voltage detection circuit according to a first embodiment of this invention is applied. In FIG. 1, a vehicle AC power generator 1 is connected to a battery 2 serving as a power supply in which generated power is stored.

Further, the vehicle AC power generator 1 includes a power generation control device 11, a field coil 12, an armature coil 13, and a rectifier 14. The power generation control device 11 supplies an excitation current to the field coil 12, and controls a power generation voltage by adjusting the excitation current. Furthermore, the power generation control device 11 includes a phase voltage detection circuit 100 and a voltage control circuit 200.

The phase voltage detection circuit 100 detects a phase voltage signal generated by the armature coil 13, and outputs a phase voltage detection signal in the form of a digital signal. The voltage control circuit 200 controls a gate voltage of a transistor used to adjust the excitation current of the field coil 12 on the basis of the phase voltage detection signal from the phase voltage detection circuit 100.

Figure 2:
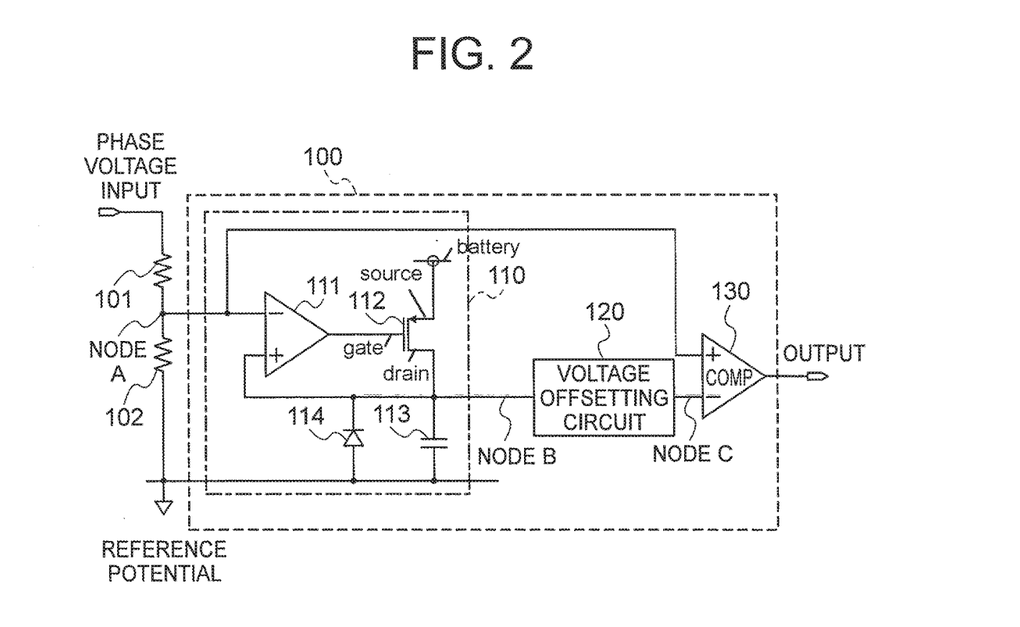
FIG. 2 is a circuit diagram showing the phase voltage detection circuit according to the first embodiment of this invention.

FIG. 2 is a circuit diagram showing the phase voltage detection circuit according to the first embodiment of this invention. In FIG. 2, a phase voltage signal divided by a resistor 101 and a resistor 102 is input into the phase voltage detection circuit 100. Further, the phase voltage detection circuit 100 includes a peak hold circuit 110, a voltage offsetting circuit 120, and a comparator 130.

The peak hold circuit 110 determines an envelope of the phase voltage signal (node A) using an operational amplifier 111. The voltage offsetting circuit 120 shifts an output voltage (node B) from the peak hold circuit 110 by a preset offset amount. The comparator 130 compares the phase voltage signal with an output voltage (node C) from the voltage offsetting circuit 120, and outputs a phase voltage detection signal.

As described above, the phase voltage detection circuit 100 is required to detect a phase voltage signal even when an amplitude and a DC bias voltage of the phase voltage signal are equal to or smaller than approximately 0.7 V, i.e. a forward voltage of a diode, and therefore a configuration in which a diode is used as the peak hold circuit 110 cannot be employed.

Hence, the peak hold circuit 110 according to the first embodiment of this invention includes the operational amplifier 111, the divided phase voltage signal being connected to an inverting input terminal thereof, a PMOS transistor 112 having a gate, a source, and a drain that are connected respectively to an output terminal of the operational amplifier 111, a power supply, and a non-inverting input terminal of the operational amplifier 111, and a capacitor 113 and a diode 114 that are connected between the drain of the PMOS transistor 112 and a reference potential.

Note that a discharge resistor must be connected to the output of the peak hold circuit 110 with respect to the reference potential. As described above, however, the phase voltage detection circuit 100 is required to detect a phase voltage signal having a frequency range of several hundred Hz, and therefore either a resistance value of the discharge resistor must be set at an extremely large value, or a capacitance value of the capacitor 113 must be set at an extremely large value. Here, the discharge resistor is constituted by the diode 114 so that the discharge resistor can be mounted on an integrated circuit.

Figure 3:
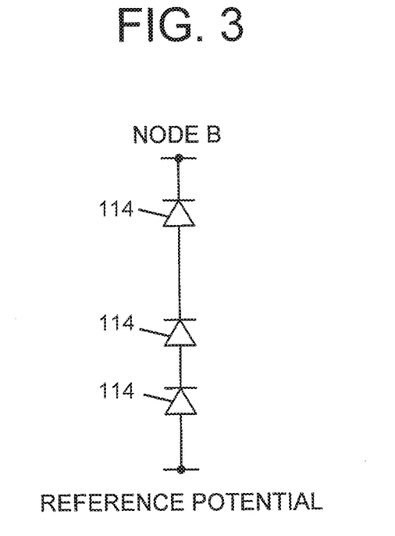
FIG. 3 is a circuit diagram showing discharge resistors in a peak hold circuit of the phase voltage detection circuit according to the first embodiment of this invention.

Here, when a potential of node B is higher than the reference potential, only a small reverse current flows through the diode 114, and therefore the diode 114 can be used as high resistance. Further, by employing the diode 114 as the discharge resistor, the capacitance value of the capacitor 113 can be set at a value enabling mounting on an integrated circuit. Furthermore, by connecting a plurality of diodes in series, as shown in FIG. 3, an even higher resistance value can be realized.

Figure 4:
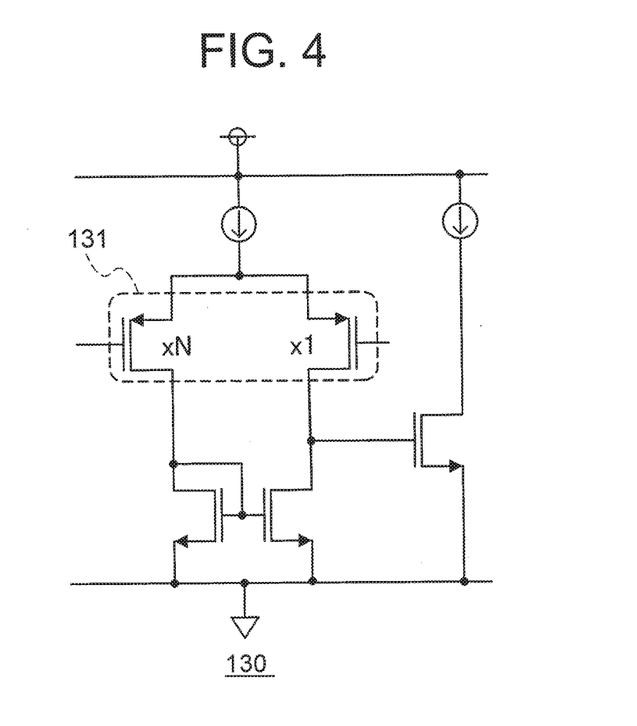
FIG. 4 is a circuit diagram showing a comparator of the phase voltage detection circuit according to the first embodiment of this invention.

FIG. 4 is a circuit diagram showing the comparator of the phase voltage detection circuit according to the first embodiment of this invention. In FIG. 4, a ratio between MOS transistors forming 11 an input differential pair 131 of the comparator 130 is set at N to 1 so that the comparator 130 reacts to the envelope of the phase voltage signal, which serves as the output of the peak hold circuit 110 into which the phase voltage signal is input, at a voltage reduced by a fixed voltage. As a result, the voltage offsetting circuit 120 and the comparator 130 can be realized integrally.

Figure 5:
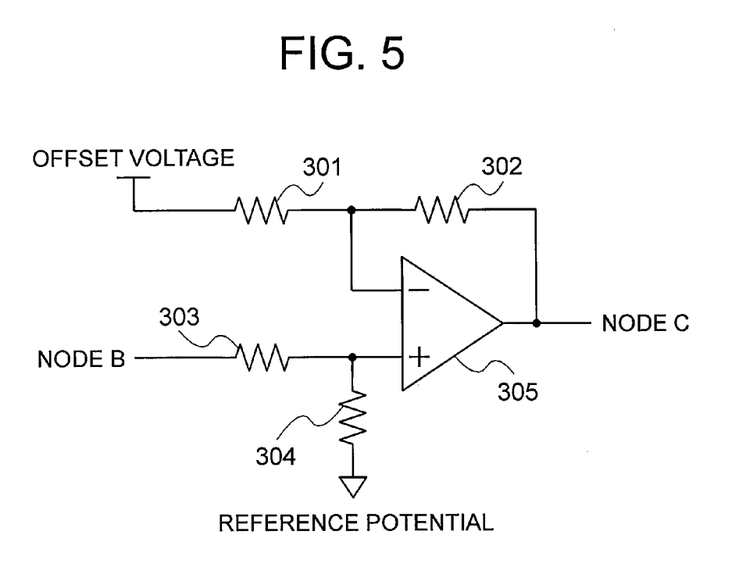
FIG. 5 is a circuit diagram showing a typical subtraction circuit.

Note that a subtraction circuit such as that shown in FIG. 5 is typically employed as a voltage offsetting circuit. The subtraction circuit includes four resistors 301 to 304 and an operational amplifier 305. The resistor 301 is connected between an offset voltage and an inverting input terminal of the operational amplifier 305. The resistor 302 is connected between an output terminal and the inverting input terminal of the operational amplifier 305. The resistor 303 is connected between node B and a non-inverting input terminal of the operational amplifier 305. The resistor 304 is connected between the non-inverting input terminal of the operational amplifier 305 and the reference potential.

As described above, an inductance of node B serving as the output of the peak hold circuit 110 must be set to be high, but with the configuration shown in FIG. 5, the resistor 303 and the resistor 304 act as discharge resistors. Therefore, the subtraction circuit shown in FIG. 5 cannot be employed as the voltage offsetting circuit 120. Note that when the subtraction circuit shown in FIG. 5 is used as the voltage offsetting circuit 120, a buffer amplifier must be inserted between the voltage offsetting circuit 120 and the peak hold circuit 110.

In the phase voltage detection circuit 100 according to the first embodiment of this invention, by employing the comparator 130, in which the ratio of the input differential pair is N to 1, as the voltage offsetting circuit 120, the need to mount the voltage offsetting circuit 120 separately can be eliminated, and as a result, a circuit area can be reduced. Further, by employing the voltage offsetting circuit 120, the offset amount can be set easily during circuit design, and therefore erroneous detection of the phase voltage signal can be prevented.

Figure 6:
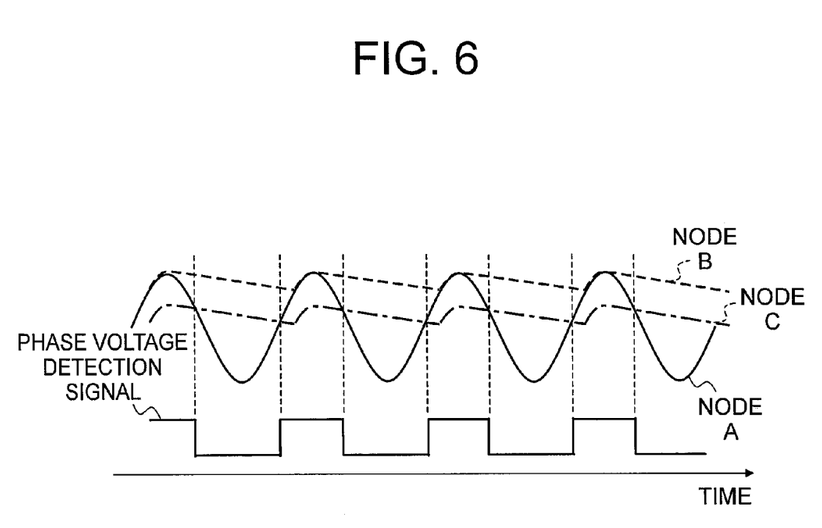
FIG. 6 is a timing chart showing an operation of the phase voltage detection circuit according to the first embodiment of this invention.

An operation of the phase voltage detection circuit 100 thus configured will be described below with reference to a timing chart shown in FIG. 6. FIG. 6 is a timing chart showing an operation of the phase voltage detection circuit according to the first embodiment of this invention. Further, FIG. 6 shows respective operation waveforms of node A, node B, and node C of the phase voltage detection circuit 100, and the phase voltage detection signal serving as the output of the phase voltage detection circuit 100.

First, the phase voltage signal input into the phase voltage detection circuit 100 is divided by the resistor 101 and the resistor 102 so as to form the waveform of node A. Next, the waveform of node B is obtained by the peak hold circuit 110 as an envelope of the waveform of node A. Next, the waveform of node B is shifted by the voltage offsetting circuit 120, whereby the waveform of node C is obtained. The waveform of node C serves as a threshold voltage of the comparator 130.

The threshold voltage varies in accordance with the phase voltage signal, and therefore serves as a variable threshold voltage. The comparator 130 compares the divided phase voltage signal, represented by the waveform of node A, with the threshold voltage, represented by the waveform of node C, and as a result, a phase voltage detection signal that can be input into a digital circuit can be obtained as the output waveform regardless of the DC bias voltage of the phase voltage signal.

According to the first embodiment, as described above, the peak hold circuit determines the envelope of the phase voltage signal using the operational amplifier, the voltage offsetting circuit shifts the output voltage from the peak hold circuit by the preset offset amount, and the comparator compares the phase voltage signal with the output voltage from the voltage offsetting circuit and outputs the phase voltage detection signal.

As a result, the phase voltage signal can be detected reliably, whereupon power generation can be started, even when a leak current flows in and the DC bias voltage of the phase voltage signal varies.

Second Embodiment

Figure 7:
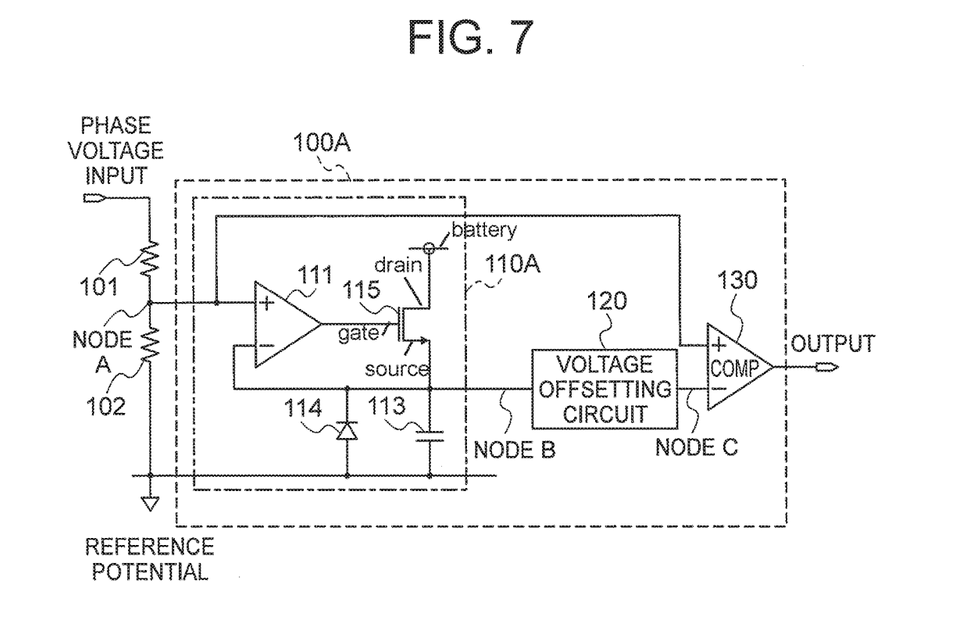
FIG. 7 is a circuit diagram showing a phase voltage detection circuit according to a second embodiment of this invention.

FIG. 7 is a circuit diagram showing a phase voltage detection circuit according to a second embodiment of this invention. In FIG. 7, a phase voltage detection circuit 100A includes a peak hold circuit 110A in place of the peak hold circuit 110 shown in FIG. 2. Note that the voltage offsetting circuit 120 and the comparator 130 are identical to those of the first embodiment, shown in FIG. 2, and therefore description thereof has been omitted.

The peak hold circuit 110A includes the operational amplifier 111, the divided phase voltage signal being connected to the non-inverting input terminal thereof, an NMOS transistor 115 having a gate, a drain, and a source that are connected respectively to the output terminal of the operational amplifier 111, the power supply, and the inverting input terminal of the operational amplifier 111, and the capacitor 113 and the diode 114 that are connected between the drain of the NMOS transistor 115 and the reference potential.

The phase voltage detection circuit 100A is required to operate prior to the start of power generation, i.e. prior to reception of an activation signal from the vehicle, and must therefore be operated by the power supply at all times. In other words, a circuit provided in the phase voltage detection circuit 100A to detect the amplitude of the phase voltage signal and activate an internal circuit must be operated at all times by the power supply, while a circuit for detecting the frequency of the phase voltage signal can be operated by an internally generated power supply. Here, by employing an internally generated power supply, the frequency of the phase voltage signal can be detected more precisely.

Figure 8:
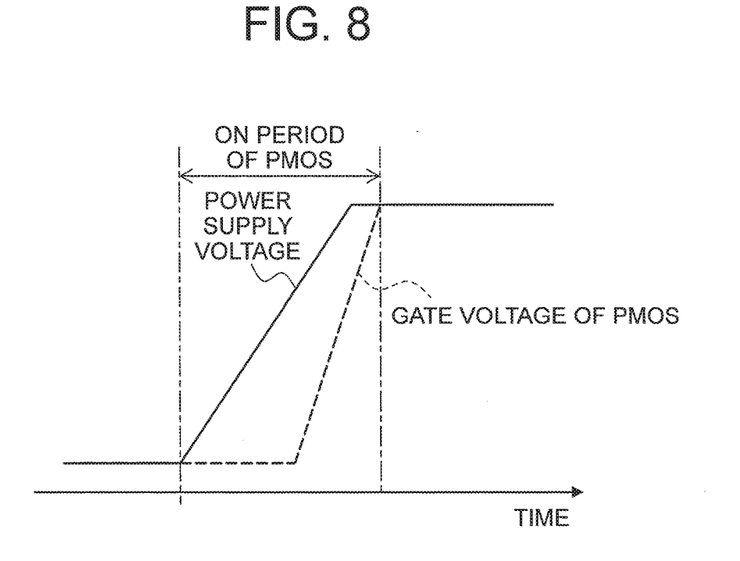
FIG. 8 is a view illustrating a problem occurring in the phase voltage detection circuit according to the first embodiment of this invention.

Note that when an internally generated power supply is used by the peak hold circuit and an output transistor is constituted by the PMOS transistor 112 according to the first embodiment, shown in FIG. 2, the PMOS transistor remains ON for a period extending until the gate of the PMOS transistor is charged at the time of power supply activation, as shown in FIG. 8.

As a result, the output of the peak hold circuit increases to the power supply potential at the time of activation. As described above, the discharge resistor of the peak hold circuit according to this invention has a high resistance. Therefore, when the output voltage increases to the power supply potential, discharge is delayed, and during the delay, the peak hold circuit does not operate as a peak hold circuit.

When the NMOS transistor 115 is used as the output transistor, on the other hand, the NMOS transistor 115 is OFF at the time of power supply activation, and therefore the output of the peak hold circuit 110A does not increase. As a result, the period in which the peak hold circuit 110A does not operate as a peak hold circuit following power supply activation can be eliminated.

Third Embodiment

Figure 9:
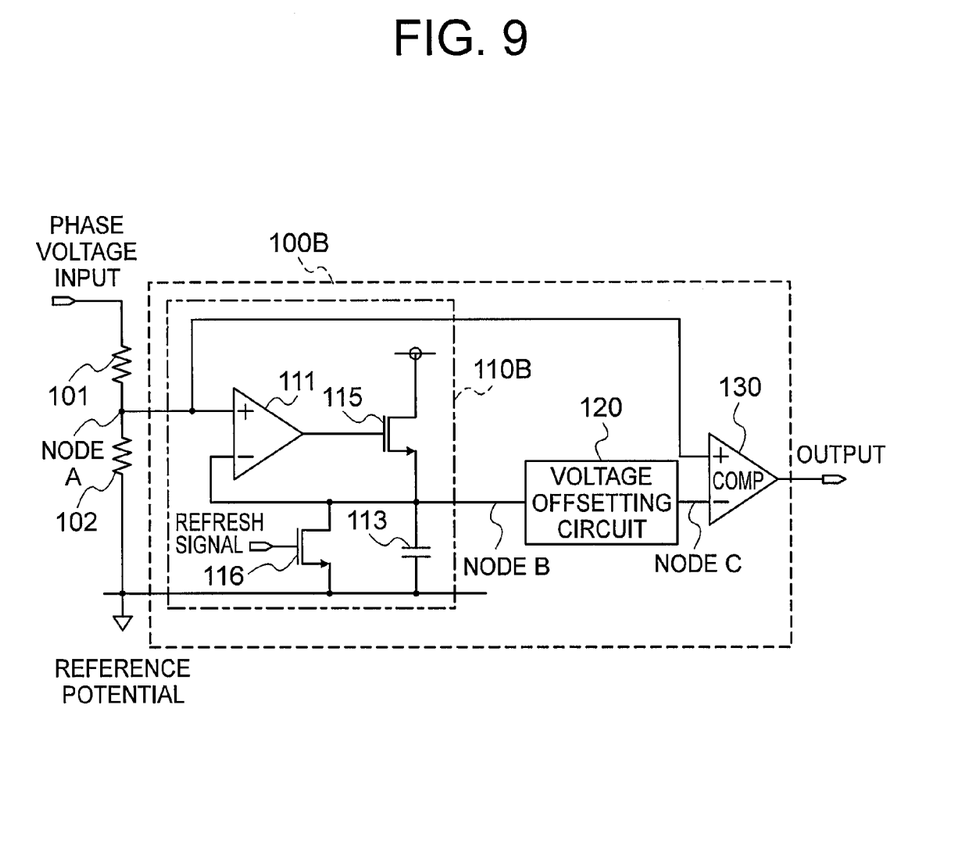
FIG. 9 is a circuit diagram showing a phase voltage detection circuit according to a third embodiment of this invention.

FIG. 9 is a circuit diagram showing a phase voltage detection circuit according to a third embodiment of this invention. In FIG. 9, a phase voltage detection circuit 100B includes a peak hold circuit 110B in place of the peak hold circuit 110A shown in FIG. 7. Note that the voltage offsetting circuit 120 and the comparator 130 are identical to those of the second embodiment, shown in FIG. 7, and therefore description thereof has been omitted.

The peak hold circuit 110B includes an NMOS transistor 116 in place of the diode 114 serving as the discharge resistor, shown in FIG. 7. A gate of the NMOS transistor 116 is controlled by a refresh signal from a control circuit, not shown in the drawing, to a Low level when the peak hold circuit 110B operates as a peak hold circuit, and to a High level when an output of the peak hold circuit 110B short-circuits to the reference potential.

Note that in the phase voltage detection circuit 100A according to the second embodiment, shown in FIG. 7, the inductance of node B serving as the output of the peak hold circuit 110A is high. Therefore, when the voltage of node B increases due to noise or the like, discharge is delayed, and during the delay, the peak hold circuit 110A does not operate as a peak hold circuit.

In the peak hold circuit 110B according to the third embodiment of this invention, on the other hand, the NMOS transistor 116 is OFF when the gate of the NMOS transistor 116 is at the Low level, and therefore a parasitic diode between a drain and a back gate can be used as a discharge resistor.

Further, when the gate of the NMOS transistor 116 is at the High level, the NMOS transistor 116 is ON, and therefore a short circuit occurs between node B and the reference potential such that node B reaches an identical potential to the reference potential. Hence, by setting the gate of the NMOS transistor 116 at the High level periodically, a situation in which the peak hold circuit 110B stops operating due to noise or the like can be prevented from occurring.

Note that this invention is not limited to the first to third embodiments described above, and the configurations of the first to third embodiments may be appropriately combined, partially modified, or partially omitted within a scope that does not depart from the spirit of the invention.

What is claimed is:

1. A phase voltage detection circuit that detects a phase voltage signal generated by an armature coil of an alternating current (AC) power generator, the phase voltage detection circuit comprising:
    a peak hold circuit that determines an envelope of the phase voltage signal using an operational amplifier, and generates an output voltage that has a first signal waveform based on the envelope of the phase voltage signal, wherein the first signal waveform has a same peak value as the envelope of the phase voltage signal, and an amplitude of the first signal waveform linearly decreases between two adjacent peak points among a plurality of peak points of the first signal waveform;
    a voltage offsetting circuit that shifts the output voltage from the peak hold circuit by a preset offset amount to generate a second signal waveform that has a same waveform as the first signal waveform and a different peak value than the peak value of the first signal waveform; and
    a comparator that compares the phase voltage signal with the second signal waveform, and generates a phase voltage detection signal based on the comparison between the phase voltage signal and the second signal waveform.

2. A power generation control device comprising the phase voltage detection circuit according to claim 1.

3. A phase voltage detection circuit that detects a phase voltage signal generated by an armature coil of an alternating current (AC) power generator, the phase voltage detection circuit comprising:
    a peak hold circuit that determines an envelope of the phase voltage signal using an operational amplifier;
    a voltage offsetting circuit that shifts an output voltage from the peak hold circuit by a preset offset amount;
    a comparator that compares the phase voltage signal with the shifted output voltage from the voltage offsetting circuit, and outputs a phase voltage detection signal,
    wherein the peak hold circuit includes:
        the operational amplifier including an inverting input terminal to which the phase voltage signal is inputted;
        a PMOS transistor having a gate, a source, and a drain that are connected respectively to an output terminal of the operational amplifier, a power supply, and a non-inverting input terminal of the operational amplifier; and
        a capacitor and a diode that are connected between the drain of the PMOS transistor and a reference potential.

4. The phase voltage detection circuit according to claim 3, wherein the diode is formed from a plurality of diodes connected in series.

5. A power generation control device comprising the phase voltage detection circuit according to claim 3.

6. A phase voltage detection circuit that detects a phase voltage signal generated by an armature coil of an alternating current (AC) power generator, the phase voltage detection circuit comprising:
    a peak hold circuit that determines an envelope of the phase voltage signal using an operational amplifier;
    a voltage offsetting circuit that shifts an output voltage from the peak hold circuit by a preset offset amount;
    a comparator that compares the phase voltage signal with the shifted output voltage from the voltage offsetting circuit, and outputs a phase voltage detection signal,
    wherein the peak hold circuit includes:
        the operational amplifier, including a non-inverting input terminal to which the phase voltage signal is inputted;
        a first NMOS transistor having a gate, a drain, and a source that are connected respectively to an output terminal of the operational amplifier, a power supply, and an inverting input terminal of the operational amplifier; and
        a capacitor and a diode that are connected between the drain of the first NMOS transistor and a reference potential.

7. The phase voltage detection circuit according to claim 6, wherein the diode is formed from a plurality of diodes connected in series.

8. A power generation control device comprising the phase voltage detection circuit according to claim 6.

9. A phase voltage detection circuit that detects a phase voltage signal generated by an armature coil of an alternating current (AC) power generator, the phase voltage detection circuit comprising
    a peak hold circuit that determines an envelope of the phase voltage signal using an operational amplifier;
    a voltage offsetting circuit that shifts an output voltage from the peak hold circuit by a preset offset amount;
    a comparator that compares the phase voltage signal with the shifted output voltage from the voltage offsetting circuit, and outputs a phase voltage detection signal,
    wherein the peak hold circuit includes:
        the operational amplifier including a non-inverting input terminal to which the phase voltage signal is inputted;

a first NMOS transistor having a gate, a drain, and a source that are connected respectively to an output terminal of the operational amplifier, a power supply, and an inverting input terminal of the operational amplifier; and a capacitor and a second NMOS transistor that are connected between the drain of the first NMOS transistor and a reference potential.

10. A power generation control device comprising the phase voltage detection circuit according to claim 9.

* * * * *